(12) United States Patent
Bao et al.

(10) Patent No.: US 9,324,634 B2
(45) Date of Patent: Apr. 26, 2016

(54) SEMICONDUCTOR INTERCONNECT STRUCTURE HAVING A GRAPHENE-BASED BARRIER METAL LAYER

(75) Inventors: Junjing Bao, Fishkill, NY (US); Shaoning Yao, Wappingers Falls, NY (US); Xuesong Li, Yorktown Heights, NY (US); Samuel S. S. Choi, Beacon, NY (US)

(73) Assignee: International Business Machines Corporation, Armonk, NY (US)

( * ) Notice: Subject to any disclaimer, the term of this patent is extended or adjusted under 35 U.S.C. 154(b) by 578 days.

(21) Appl. No.: 13/291,470

(22) Filed: Nov. 8, 2011

(65) Prior Publication Data
US 2013/0113102 A1   May 9, 2013

(51) Int. Cl.
   *H01L 23/482* (2006.01)
   *H01L 23/532* (2006.01)
   *H01L 21/768* (2006.01)
   (Continued)

(52) U.S. Cl.
   CPC ...... *H01L 23/4827* (2013.01); *H01L 21/76843* (2013.01); *H01L 21/76846* (2013.01); *H01L 21/76873* (2013.01); *H01L 23/481* (2013.01); *H01L 23/53238* (2013.01); *B82Y 40/00* (2013.01); *H01L 2221/1089* (2013.01); *H01L 2924/0002* (2013.01)

(58) Field of Classification Search
   CPC .......... H01L 21/76873; H01L 23/53238; H01L 2221/1089; H01L 21/76843; H01L 21/76846; H01L 23/481; H01L 23/4872
   USPC .......................................... 438/643; 257/751
   See application file for complete search history.

(56) References Cited

U.S. PATENT DOCUMENTS 6,979,625 B1 * 12/2005 Woo et al. ............... 438/309
7,646,077 B2    1/2010 Lu et al.
(Continued)

FOREIGN PATENT DOCUMENTS

WO    2005091345 A1    9/2005

OTHER PUBLICATIONS

"Effect of Substrate Roughness and Feedstock Concentration on growth of Wafer-Scale Graphene at Atmospheric Pressure" by Zhengtang Luo, Ye Lu, Daniel W. Singer, Matthew E. Berck, Luke A. Somers, Brett R. Goldsmith, and A.T. Charlie Jonhson, Chem. Mater., 2011.*

(Continued)

*Primary Examiner* — Eva Y Montalvo
*Assistant Examiner* — Nga Doan
(74) *Attorney, Agent, or Firm* — Maeve L. McCarthy; Abdul-Samad A. Adediran

(57) ABSTRACT

An interconnect structure and method for fabricating the interconnect structure having enhanced performance and reliability, by utilizing a graphene-based barrier metal layer to block oxygen intrusion from a dielectric layer into the interconnect structure and block copper diffusion from the interconnect structure into the dielectric layer, are disclosed. At least one opening is formed in a dielectric layer. A graphene-based barrier metal layer disposed on the dielectric layer is formed. A seed layer disposed on the graphene-based barrier metal layer is formed. An electroplated copper layer disposed on the seed layer is formed. A planarized surface is formed, wherein a portion of the graphene-based barrier metal layer, the seed layer, and the electroplated copper layer are removed. In addition, a capping layer disposed on the planarized surface is formed.

10 Claims, 7 Drawing Sheets

(51) Int. Cl.
    *H01L 23/48*     (2006.01)
    *B82Y 40/00*     (2011.01)

(56) References Cited

U.S. PATENT DOCUMENTS

| | | | |
|---|---|---|---|
| 7,745,047 | B2 | 6/2010 | Zhamu et al. |
| 7,781,061 | B2 | 8/2010 | Garcia et al. |
| 7,790,242 | B1* | 9/2010 | Sumanasekera et al. ...... 427/458 |
| 7,811,906 | B1 | 10/2010 | Bol et al. |
| 7,932,549 | B2 | 4/2011 | Holmes et al. |
| 2004/0137730 | A1 | 7/2004 | Kim et al. |
| 2009/0117733 | A1* | 5/2009 | Dubin et al. .................. 438/653 |
| 2009/0140801 | A1 | 6/2009 | Ozyilmaz et al. |
| 2009/0257270 | A1* | 10/2009 | Schricker et al. ............. 365/148 |
| 2009/0291270 | A1 | 11/2009 | Zettl et al. |
| 2009/0308520 | A1 | 12/2009 | Shin et al. |
| 2010/0000441 | A1 | 1/2010 | Jang et al. |
| 2010/0021708 | A1 | 1/2010 | Kong et al. |
| 2010/0035186 | A1 | 2/2010 | Hong et al. |
| 2010/0044646 | A1 | 2/2010 | Zhamu et al. |
| 2010/0055025 | A1 | 3/2010 | Jang et al. |
| 2010/0055458 | A1 | 3/2010 | Jang et al. |
| 2010/0056819 | A1 | 3/2010 | Jang et al. |
| 2010/0127312 | A1 | 5/2010 | Grebel et al. |
| 2010/0144904 | A1 | 6/2010 | Wang et al. |
| 2010/0163285 | A1 | 7/2010 | Marinero |
| 2010/0178464 | A1 | 7/2010 | Choi et al. |
| 2010/0181655 | A1 | 7/2010 | Colombo et al. |
| 2010/0224851 | A1* | 9/2010 | Colombo .......... H01L 21/02612 257/9 |
| 2010/0255984 | A1 | 10/2010 | Sutter et al. |
| 2010/0258787 | A1 | 10/2010 | Chae et al. |
| 2011/0006425 | A1 | 1/2011 | Wada et al. |
| 2011/0240951 | A1* | 10/2011 | Yang et al. ......................... 257/5 |
| 2012/0139114 | A1* | 6/2012 | Zhang ............... H01L 21/76849 257/751 |
| 2014/0106561 | A1* | 4/2014 | Niyogi .................. C23C 14/042 438/643 |

OTHER PUBLICATIONS

"Carbon Nanotubes Graphene for Various Applications in Electronics: Competition and Synergy" by Didier Pribat and Y. H. Lee.*
Jian-Hao Chen et al., "Intrinsic and extrinsic performance limits of graphene devices on SiO2," Nature Nanotechnology, Apr. 2008, pp. 206-209, vol. 3, published online Mar. 23, 2008, Nature Publishing Group.
Shanshan Chen et al., "Oxidation Resistance of Graphene-Coated Cu and Cu/Ni Alloy," pp. A-G, ACS Nano. Received for review Nov. 8, 2010 and accepted Jan. 13, 2011. (Version 1).
Shanshan Chen et al., "Oxidation Resistance of Graphene-Coated Cu and Cu/Ni Alloy," vol. 5, No. 2, pp. 1321-1327, ACS Nano, 2011. Received for review Nov. 8, 2010 and accepted Jan. 13, 2011, published online Jan. 28, 2011. (Version 2).
Xiangyu Chen et al., "Fully Integrated Graphene and Carbon Nanotube Interconnects for Gigahertz High-Speed CMOS Electronics," IEEE Transactions on Electron Devices, Nov. 2010, pp. 3137-3143, vol. 57, No. 11, IEEE.
Xuesong Li et al., "Graphene Films with Large Domain Size by a Two-Step Chemical Vapor Deposition Process," Nano Letters, 2010, 10 (11), pp. 4328-4334, published online Oct. 19, 2010, American Chemical Society.
G.A. Lopez et al., "The solubility of C in solid Cu," Scripta Materialia, Jul. 2004, pp. 1-5, vol. 51, Issue 1, Elsevier Ltd.
Raghunath Murali et al., "Breakdown current density of graphene nanoribbons," Applied Physics Letters, 2009, 243114-1-243114-3, vol. 94, Issue 24, published online Jun. 19, 2009, American Institute of Physics.
U.S. Appl. No. 14/525,886, filed Oct. 28, 2014.

* cited by examiner

SEMICONDUCTOR INTERCONNECT STRUCTURE HAVING A GRAPHENE-BASED BARRIER METAL LAYER

BACKGROUND OF THE INVENTION

1. Field of the Invention

The present invention relates to a semiconductor integrated circuit interconnect structure and method for fabricating an interconnect structure having enhanced performance and reliability, by utilizing a graphene-based barrier metal layer to block oxygen intrusion from a dielectric layer into the interconnect structure and block copper diffusion from the interconnect structure into the dielectric layer.

2. Description of the Related Art

Semiconductor devices include a plurality of circuit components (i.e., transistors, resistors, diodes, capacitors, etc.) connected together to form an integrated circuit fabricated on a semiconductor substrate. A complex network of semiconductor integrated circuit interconnects (interconnects) are routed to connect the circuit components distributed on the surface of the substrate. Efficient routing of these interconnects, across semiconductor devices, requires formation of multi-level or multi-layered patterning schemes, such as single or dual damascene interconnect structures.

An interconnect structure includes metal vias that run perpendicular to the semiconductor substrate. The metal vias are disposed in trench areas. In addition, an interconnect structure includes metal lines that are disposed in the trench areas, wherein the trench areas are formed in a dielectric layer. The metal vias are connected to the metal lines, and the metal lines run parallel to the semiconductor substrate. Thus, both the metal lines and metal vias are on and adjacent to the dielectric layer having a dielectric constant (k) ranging from about 1.0 to about 3.0, which reduces parasitic capacitance and thereby allows faster signal speed and less signal crosstalk (i.e., crosstalk refers to a signal being transmitted through a metal line, and affecting another signal being transmitted through a separate metal line, and/or affecting other parts of circuitry in an undesired manner).

Furthermore, an interconnect structure that is copper-based, when compared with an aluminum based interconnect structure, provides higher speed signal transmission between large numbers of transistors on a complex semiconductor chip. Accordingly, when manufacturing integrated circuits, copper (i.e., a metal conductor) is typically used for forming the semiconductor integrated circuit's interconnects, because of copper's low resistivity and high current carrying capacity. Resistivity is the measure of how much a material opposes electric current, due to a voltage being placed across the material. However, when copper is utilized to form interconnects, electromigration may occur.

Electromigration is the gradual displacement of atoms within a metal conductor due to high density of current passing through the metal conductor, and electromigration is accelerated when the temperature of the metal conductor increases. In addition, electromigration can occur when there is gradual displacement of atoms within a metal conductor of an interconnect structure, wherein the atoms diffuse across a barrier metal layer of the interconnect structure into a dielectric layer that structurally supports the interconnect structure. Electromigration can result in void formation as well as extrusion/hillock formation along regions of an interconnect structure. The voids can result in an open circuit if one or more voids formed are large enough to sever the interconnect structure, and the extrusions/hillocks can result in a short circuit if one or more extrusions/hillocks are sufficiently long to form a region of abnormally low electrical impedance.

In addition, if an interconnect structure is copper-based then oxygen intrusion, from moisture in a dielectric layer that structurally supports the interconnect structure, into copper areas of the interconnect structure can reduce the performance of the interconnect structure. Specifically, oxygen that intrudes a seed layer and/or an electroplated copper layer of the interconnect structure can increase the resistivity of the interconnect structure. If the resistivity of the interconnect structure increases then ion mobility decreases, which translates to reduced current flow through the interconnect structure. Failure to adequately block oxygen intrusion into the interconnect structure and block copper diffusion into the dielectric layer can result in a reduction of performance and electromigration reliability of the interconnect structure, a reduction in the useful life of semiconductor integrated circuit products, and even sudden data loss.

Currently, tantalum or tantalum nitride is the material typically utilized to form a barrier metal layer of an interconnect structure. As the size of semiconductor devices become smaller a challenge arises of forming the interconnect structure having a barrier metal layer that includes mainly tantalum or tantalum nitride, because the tantalum and tantalum nitride will occupy too much volume of the interconnect structure and leave less volume available for copper deposition as part of the interconnect structure. For example, a tantalum or tantalum nitride barrier metal layer is often deposited, utilizing physical vapor deposition (PVD) techniques, to a thickness ranging from about 5 nm to about 10 nm in order to achieve the desired characteristics of blocking oxygen intrusion into the interconnect structure and blocking copper diffusion into the dielectric layer. A tantalum or tantalum nitride barrier metal layer having a thickness ranging from about 5 nm to about 10 nm consumes too much volume of the interconnect structure, and causes the interconnect structure to have high resistivity. However, it is desirable to have a thin barrier metal layer and more volume of the interconnect structure available for copper, instead of tantalum or tantalum nitride, in order to reduce electrical resistivity and resistive-capacitive delay of signal propagation through the interconnect structure.

SUMMARY

The present invention relates to a structure and method for fabricating an interconnect structure having enhanced performance and reliability, by utilizing a graphene-based barrier metal layer to block oxygen intrusion from a dielectric layer into the interconnect structure and block copper diffusion from the interconnect structure into the dielectric layer.

In one aspect, embodiments of the present invention provide an interconnect structure, and a method for fabricating the interconnect structure with at least one opening in a dielectric layer. A graphene-based barrier metal layer is disposed on the dielectric layer. A seed layer is disposed on the graphene-based barrier metal layer. An electroplated copper layer is disposed on the seed layer. A planarized surface is formed, wherein a portion of the graphene-based barrier metal layer, the seed layer, and the electroplated copper layer are removed. A capping layer is disposed on the planarized surface.

BRIEF DESCRIPTION OF THE SEVERAL VIEWS OF THE DRAWINGS

The subject matter which is regarded as an embodiment of the present invention is particularly pointed out and distinctly claimed in the claims at the conclusion of the specification. One manner in which recited features of an embodiment of the present invention can be understood is by reference to the following detailed description of embodiments, taken in conjunction with the accompanying drawings in which:

Figure 1:
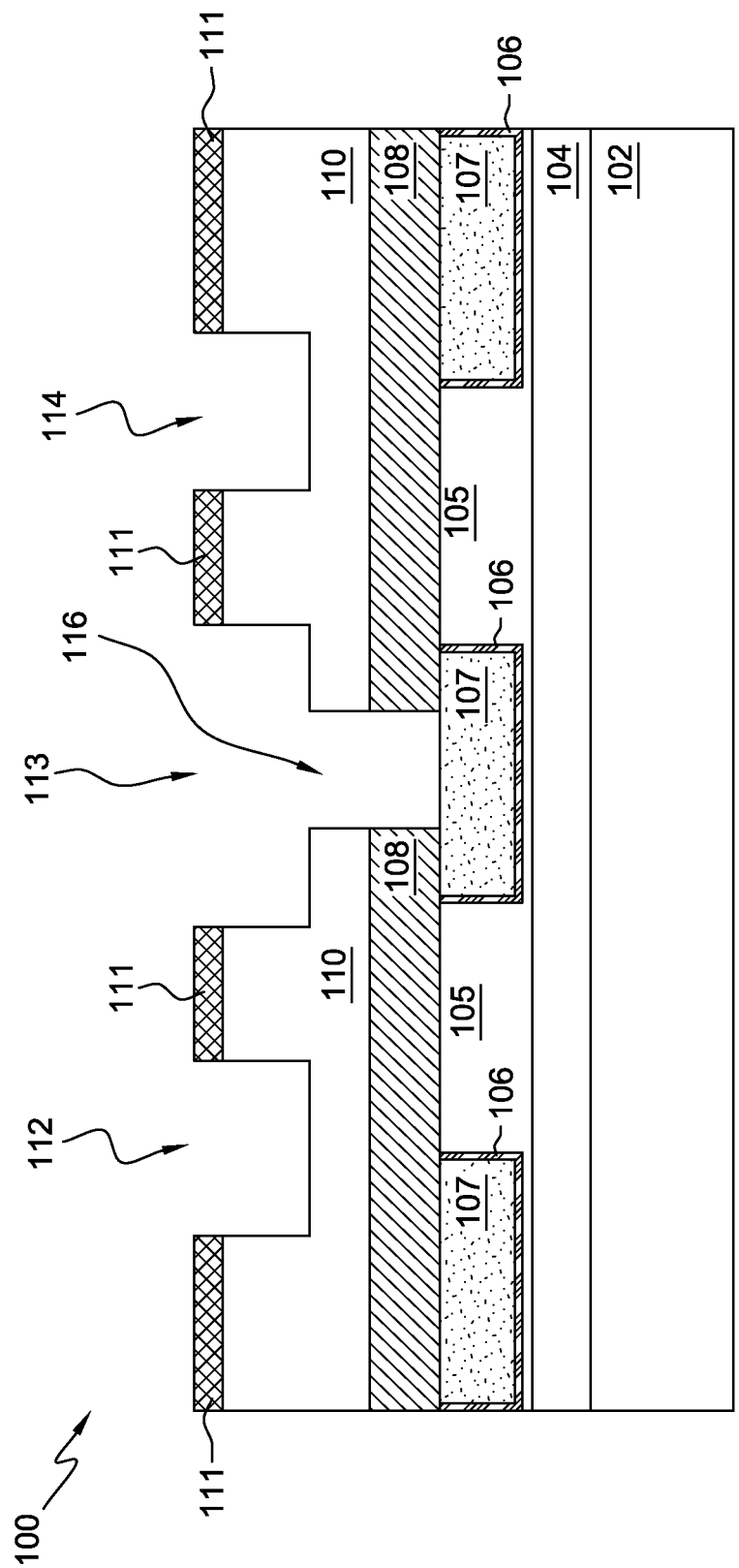
FIG. 1 is a pictorial representation (i.e., cross-sectional view) of a semiconductor illustrating the formation of trench areas and via holes (i.e., vias) according to one embodiment of the present invention.

The drawings are not necessarily to scale. The drawings, some of which are merely pictorial and schematic representations, are not intended to portray specific parameters of the invention. The drawings are intended to depict only typical embodiments of the invention, and therefore should not be considered as limiting the scope of the invention. In the drawings, like numbering represents like elements.

DETAILED DESCRIPTION

Exemplary embodiments now will be described more fully herein with reference to the accompanying drawings. This disclosure may, however, be embodied in many different forms and should not be construed as limited to the exemplary embodiments set forth herein. Rather, these exemplary embodiments are provided so that this disclosure will be thorough and complete and will fully convey the scope of this disclosure to those skilled in the art. In the description, details of well-known features and techniques may be omitted to avoid unnecessarily obscuring the presented embodiments.

The terminology used herein is for the purpose of describing particular embodiments only and is not intended to be limiting of this disclosure. As used herein, the singular forms "a", "an", and "the" are intended to include the plural forms as well, unless the context clearly indicates otherwise. Furthermore, the use of the terms "a", "an", etc., do not denote a limitation of quantity, but rather denote the presence of at least one of the referenced items. It will be further understood that the terms "comprises" and/or "comprising", or "includes" and/or "including", when used in this specification, specify the presence of stated features, regions, integers, steps, operations, elements, and/or components, but do not preclude the presence or addition of one or more other features, regions, integers, steps, operations, elements, components, and/or groups thereof.

In addition it will be understood that when an element as a layer, region, or substrate is referred to as being "on" or "over", or "disposed on" another element, it can be directly on the other element or intervening elements may also be present. In contrast, when an element is referred to as being "directly on", "directly over", or "disposed proximately to" another element, there are no intervening elements present. Moreover, it will be understood that when an element as a layer, region, dielectric, or substrate is referred to as being "on and adjacent to" or "disposed on and adjacent to" another element, it can be directly on and adjacent to the other element or intervening elements may be present. In contrast, when an element is referred to as being "directly on and adjacent to" another element, there are no intervening elements present. It will also be understood that when an element is referred to as being "connected" or "coupled" to another element, it can be directly connected or directly coupled to the other element, or intervening elements may be present. In contrast, when an element is referred to as being "directly connected" or "directly coupled" to another element, there are no intervening elements present.

Embodiments of the present invention provide a semiconductor integrated circuit interconnect structure (interconnect structure) having a graphene-based barrier metal layer, a seed layer, and an electroplated copper layer. The graphene-based barrier metal layer blocks oxygen intrusion from a dielectric layer into the interconnect structure and blocks copper diffusion from the interconnect structure into the dielectric layer. Blocking oxygen intrusion from the dielectric layer into the interconnect structure as well as blocking copper diffusion from the interconnect structure into the dielectric layer can improve integrated circuit performance, enhance electromigration reliability of the interconnect structure, minimize sudden data loss, and enhance the useful lifetime of semiconductor integrated circuit products.

FIG. 1 illustrates a cross-sectional view of semiconductor 100 including a substrate 102, transistor area layer 104, first dielectric layer 105, barrier metal layer 106, first metal layer 107, first dielectric capping layer 108, and second dielectric layer 110. Specifically, first dielectric layer 105 is formed on transistor area layer 104, wherein transistor area layer 104 is formed on substrate 102. First dielectric layer 105, barrier metal layer 106, and first metal layer 107 are subjected to a chemical-mechanical planarization (CMP) process. Subsequently, a first dielectric capping layer 108 is formed on first dielectric layer 105, barrier metal layer 106, and first metal layer 107. A second dielectric layer 110 is formed on first dielectric capping layer 108. Tetraethyl orthosilicate based (TEOS-based) hardmask layer 111 is formed on second dielectric layer 110. Utilizing photolithography and anisotropic reactive ion etching (RIE), openings are patterned through TEOS-based hardmask layer 111 and into second dielectric layer 110 to form trench areas 112-114. Moreover, via hole 116 is formed through trench area 113 and first dielectric capping layer 108. However, other conventional etching/removal techniques such as isotropic RIE, wet etching, plasma etching, or ion milling may be utilized to form trench areas 112-114 and via hole 116. Consequently, a dual damascene structure, which includes trench areas 112-114 and via hole 116, is formed.

Substrate 102 may be bulk silicon. First dielectric layer 105 and second dielectric layer 110 may include Si, C, O, and H atoms (SiCOH) or other ultra low-k dielectric material having a dielectric constant (k) ranging from about 1.0 to about 3.0. First metal layer 107 may be copper, or a copper alloy that includes manganese, aluminum, tin, or a combination thereof. Moreover, first dielectric capping layer 108 may include Si, C, N, and H atoms (SiCNH).

Figure 2:
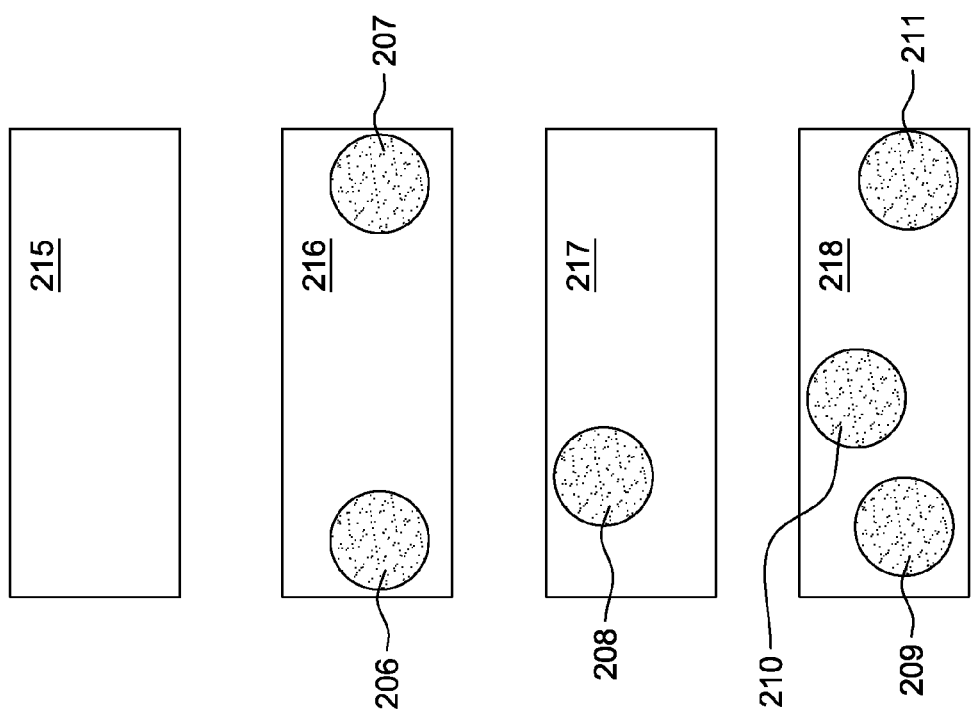
FIG. 2 depicts a top view of an array of trench areas and via holes (i.e., vias) according to one embodiment of the present invention.

FIG. 2 is a top view of an array of trench areas and via holes. Specifically, FIG. 2 depicts an array of trench areas 215-218 and via holes 206-211. A trench may not have any via holes such as trench area 215. However, trench areas can have one or more via holes such as depicted in trench areas 216-218. Moreover, via holes can be distributed uniformly in a trench area as illustrated in trench area 216, wherein via hole 206 is formed symmetrically opposite to via hole 207 in trench area 216. Alternatively, via holes can be distributed non-uniformly in a trench area as illustrated in trench areas 217-218. Lastly, there are one or more via holes at each level of semiconductor interconnects in order for all levels of the semiconductor interconnects to be electrically connected.

Figure 3:
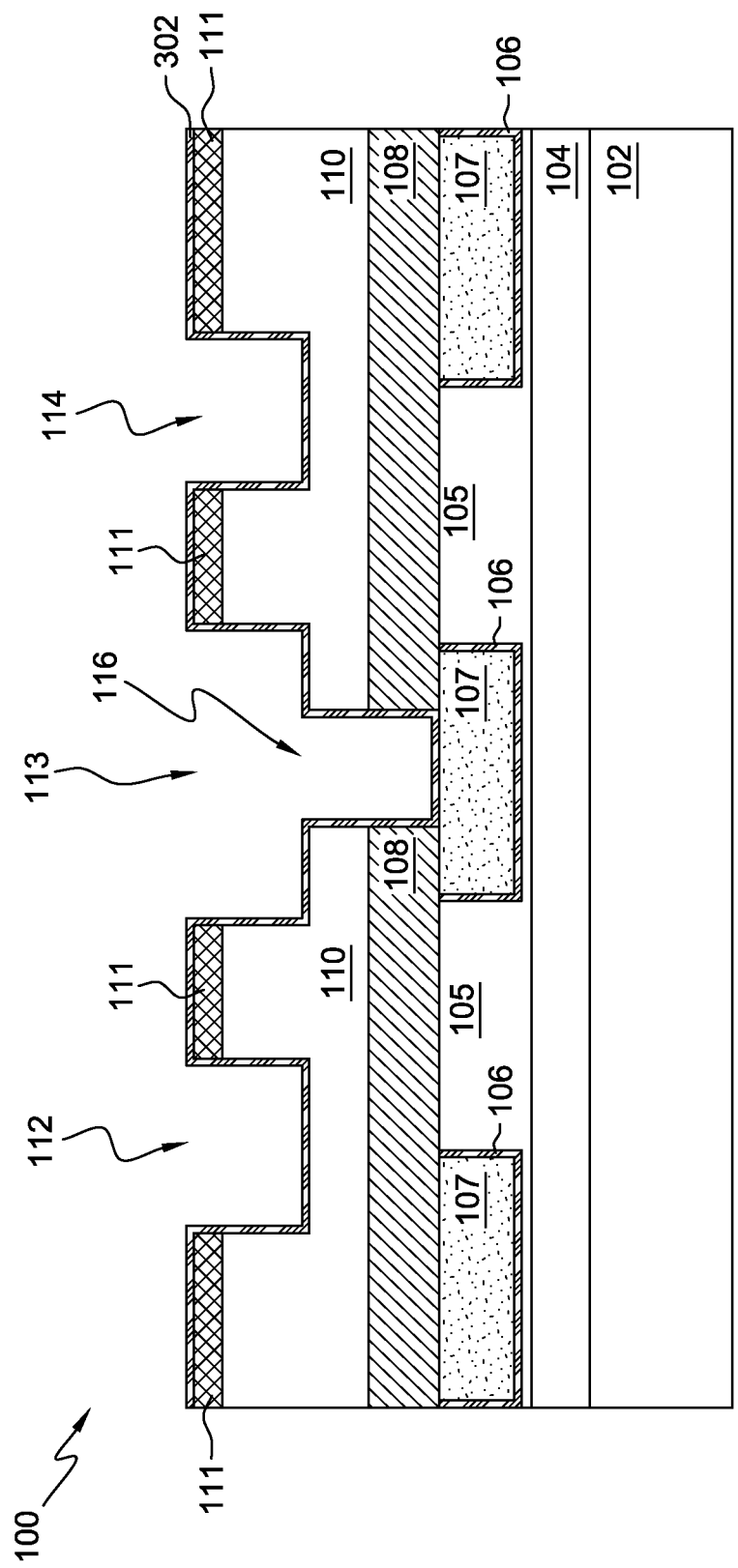
FIGS. 3-7 are pictorial representations (i.e., cross-sectional views) illustrating the formation of the trench areas and via holes having a barrier metal layer, a seed layer and an electroplated copper layer, wherein a dielectric capping layer is subsequently formed according to one embodiment of the present invention.

FIG. 3 depicts a cross-sectional view of graphene-based barrier metal layer 302 formed on and adjacent to TEOS-based hardmask layer 111 and second dielectric layer 110, adjacent to first dielectric capping layer 108, and on first metal layer 107 within via hole 116. Thus, to form an interconnect structure graphene-based barrier metal layer 302 is disposed on and adjacent to trench areas 112-114 and via hole 116 utilizing electrostatic deposition at a temperature ranging from about 15° C. to about 25° C. in which graphite that can form layered graphene is directly connected to an anode side of an electrostatic deposition apparatus, semiconductor 100 is directly connected to a cathode side of the electrostatic deposition apparatus, and trench areas 112-114 and via hole 116 are directly opposite and exposed to the graphite that is directly connected to the anode side. In one embodiment, graphene-based barrier metal layer 302 may include a single atomic layer of $sp^2$-bonded carbon atoms densely packed into a hexagonal crystal lattice. In an alternative embodiment, graphene-based barrier metal layer 302 may include a series of stacked single atomic layers of $sp^2$-bonded carbon atoms, wherein the carbon atoms of each of the single atomic layers are densely packed into a hexagonal crystal lattice. Thus, graphene-based barrier metal layer 302 may be single or multi-layered and deposited to a thickness ranging from about 0.15 nm to about 0.9 nm utilizing electrostatic deposition. In still another embodiment, graphene-based barrier metal layer 302 may be graphene or a metal alloy containing graphene, wherein the metal alloy may include, but is not limited to, tantalum and graphene, or tantalum nitride and graphene. Even if graphene-based barrier metal layer 302 is a metal alloy containing graphene, graphene-based barrier metal layer 302 may still be deposited to a thickness ranging from about 0.15 nm to about 0.9 nm by utilizing chemical vapor deposition (CVD) at a temperature ranging from about 25° C. to about 400° C.

Moreover, an interconnect structure may include a barrier metal layer, a seed layer, and an electroplated copper layer. It is desirable to have the barrier metal layer include graphene, because graphene is two-dimensional and has high electrical conductivity. In addition, graphene consumes less volume of the interconnect structure than tantalum, tantalum nitride and other conventional materials that are currently utilized, which leaves more of the volume available for subsequent deposition of copper within the interconnect structure. Hence, an advantage of a graphene-based barrier metal layer is that it can enhance the speed of an electrical signal that propagates through an interconnect structure, and allow for the fabrication of smaller semiconductor devices due to the fact that graphene consumes less volume of the interconnect structure and less wafer surface area. Another advantage of a graphene-based barrier metal layer is that it can block oxygen intrusion into the interconnect structure and block copper diffusion from the interconnect structure into an adjacent dielectric layer. Thus, graphene-based barrier metal layer 302 is important, because it can block oxygen intrusion into seed layer 305 (shown in FIG. 4) and electroplated copper layer 308 (shown in FIG. 5), and block diffusion of copper from second metal layer 314 (shown in FIG. 6) into second dielectric layer 110. Blocking diffusion of copper from second metal layer 314 can reduce the amount of void formation and extrusion/hillock formation within second metal layer 314 to provide an interconnect structure with enhanced performance and electromigration reliability. The ability of graphene-based barrier metal layer 302 to block oxygen intrusion and copper diffusion, as described above, can improve integrated circuit performance, enhance electromigration reliability of the interconnect structure, minimize sudden data loss, and enhance the useful lifetime of semiconductor integrated circuit products. Moreover, in the present embodiment barrier metal layer 106 is graphene-based, and may be formed utilizing the same fabrication techniques described above for graphene-based barrier metal layer 302.

Figure 4:
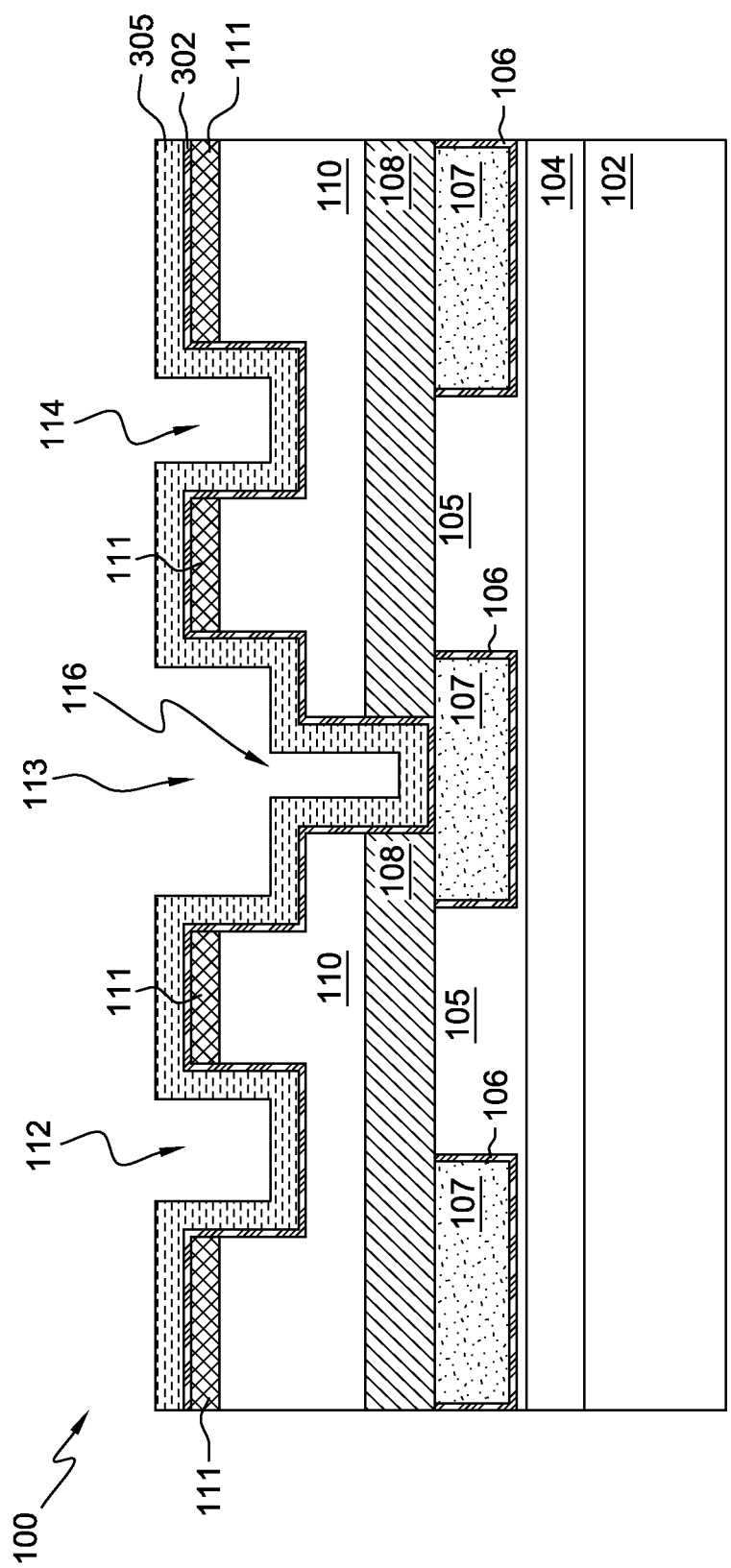

FIG. 4 illustrates the subsequent formation of seed layer 305 on graphene-based barrier metal layer 302. Atomic layer deposition (ALD), CVD, or physical vapor deposition (PVD) may be utilized to form seed layer 305, but in the present embodiment PVD is utilized wherein seed layer 305 may be pure copper or a copper alloy having impurities, wherein seed layer 305 is sputtered directly on graphene-based barrier metal layer 302. An advantage of using PVD is that copper alloy films (e.g., seed layer 305) can have a high purity that is free from unwanted impurities such as oxygen, carbon, and nitrogen. Thus, in the present embodiment seed layer 305 is a copper-manganese alloy formed utilizing PVD, but in an alternative embodiment seed layer 305 can be a copper-aluminum alloy formed using PVD. In addition, in an alternative embodiment, CVD may be utilized to form seed layer 305, because CVD allows for trench areas and via holes to be filled while also minimizing pinch-offs, void formation, and extrusion/hillock formation. If CVD is utilized to form seed layer 305 then a copper first layer can first be deposited on graphene-based barrier metal layer 302 utilizing CVD, followed by CVD of a manganese second layer (i.e., CVD of impurities) on the copper first layer, and followed by CVD of a copper third layer on the manganese second layer. Thus, in an alternative embodiment, seed layer 305 can include the copper first layer, the manganese second layer (i.e., impurities), and the copper third layer all deposited utilizing a CVD process. Still in another embodiment, to form seed layer 305 a copper-manganese layer or copper-aluminum layer can first be deposited on graphene-based barrier metal layer 302 utilizing CVD, followed by CVD of a copper layer.

Figure 5:
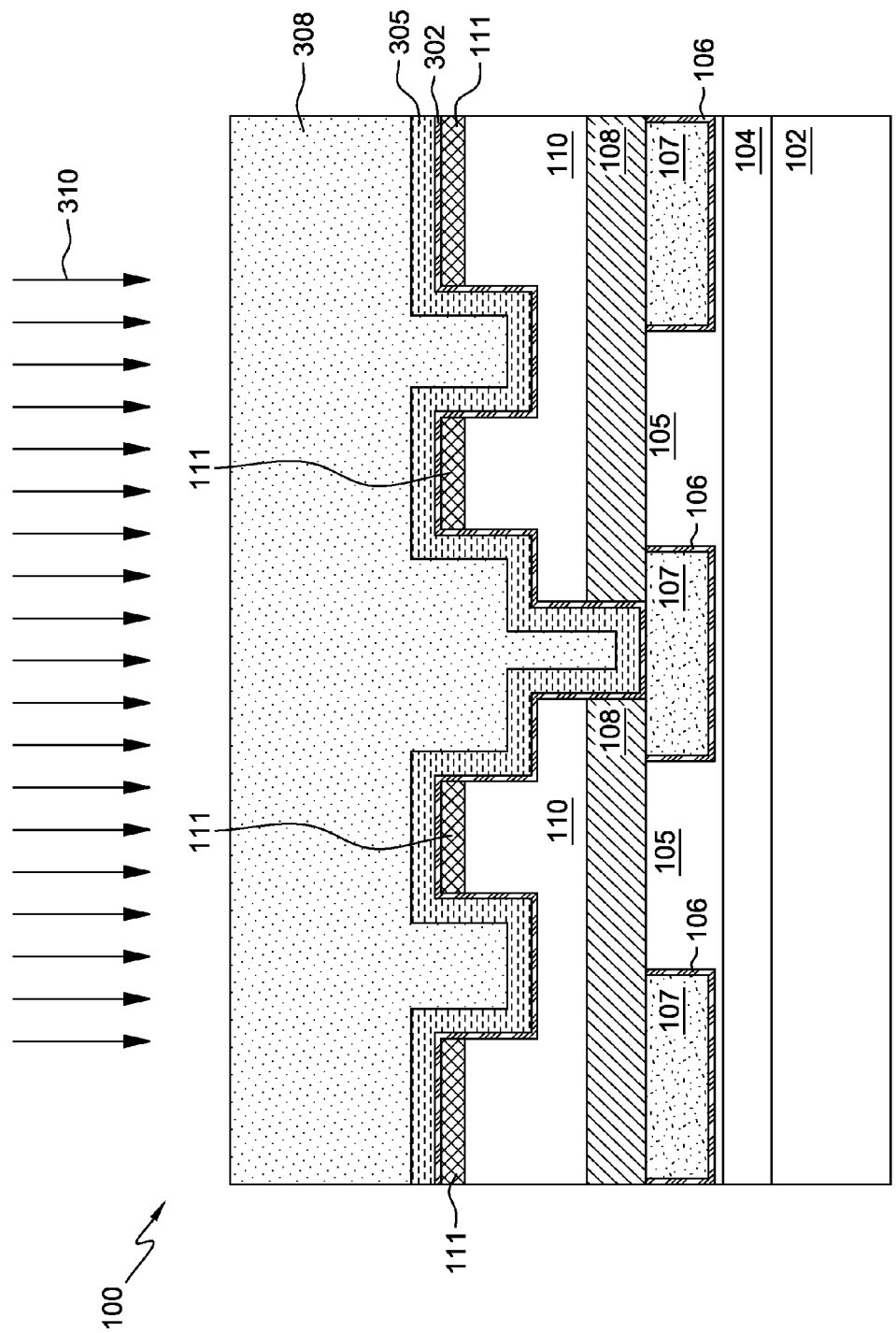

FIG. 5 illustrates the formation of electroplated copper layer 308. Specifically, electroplated copper layer 308 is disposed on seed layer 305. As a result, unfilled trench areas 112-114 and via hole 116 (shown in FIG. 4) are filled with copper, utilizing an electroplating technique. In addition, post plating anneal 310 occurs causing copper grain growth. The post plating anneal is performed at a temperature ranging from about 50° C. to about 350° C. In the present embodiment, the post plating anneal 310 results in grain growth of copper and diffusion of impurities (e.g., manganese atoms) into electroplated copper layer 308.

Figure 6:
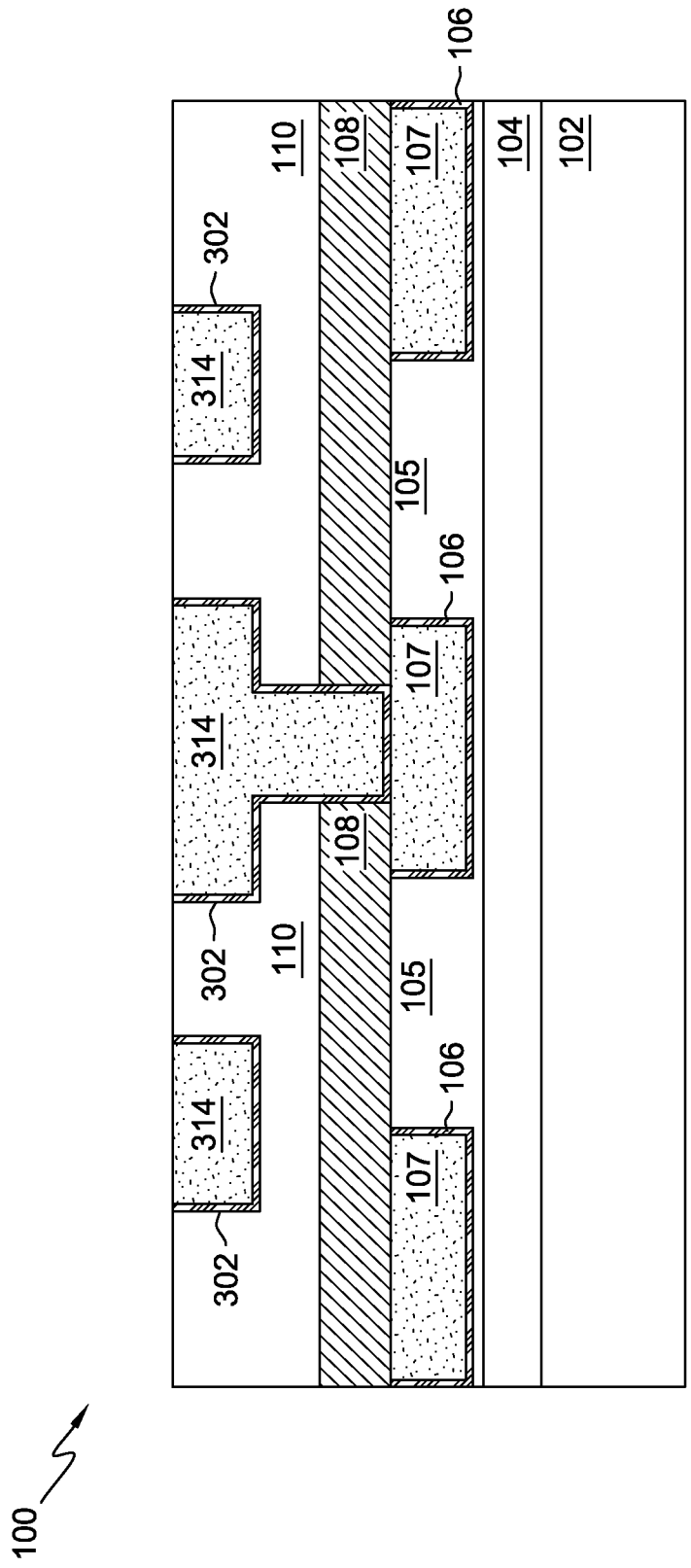

FIG. 6 illustrates an end result of a chemical-mechanical planarization (CMP) process, wherein seed layer 305 and electroplated copper layer 308 (shown in FIG. 5) have merged to form second metal layer 314. The purpose of the CMP process is to remove TEOS-based hardmask layer 111, and a portion of layers 302, 305, and 308, which provides for the formation of a quality interconnect structure and clears the way for forming a dielectric capping layer.

Figure 7:
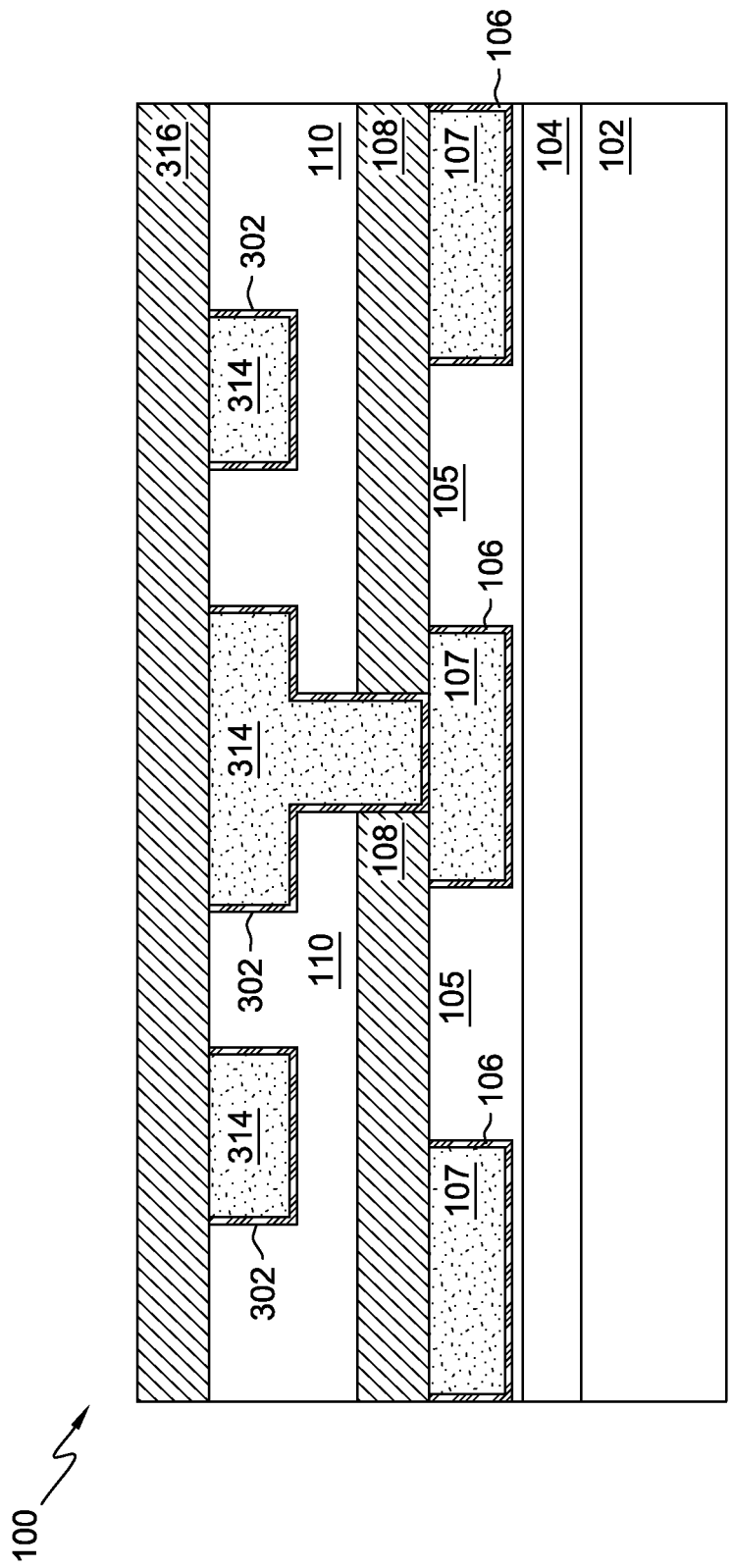

FIG. 7 illustrates the formation of second dielectric capping layer 316. In the present embodiment, after completing the CMP process illustrated in FIG. 6, second dielectric capping layer 316 is formed utilizing CVD at a temperature ranging from about 350° C. to about 450° C. Moreover, second dielectric capping layer 316 may include Si, C, N, and H atoms (SiCNH). In the present embodiment second metal layer 314 is a copper-manganese alloy, but in an alternative embodiment second metal layer 314 can be pure copper or a copper-aluminum alloy. Furthermore, as a result of additional diffusion of the impurities within second metal layer 314, triggered by the formation of second dielectric capping layer 316, a high concentration of the impurities (e.g., manganese)

may remain at the interface between second metal layer 314 and second dielectric capping layer 316. Accordingly, the high concentration of impurities (e.g., manganese) may form a segregated layer (not shown) at the interfaces between second metal layer 314 and second dielectric capping layer 316. The segregated layer can also sufficiently block diffusion of copper atoms proximate to the segregated layer, and thereby contribute to a reduction in the amount of void formation and extrusion/hillock formation within second metal layer 314 to provide an interconnect structure with enhanced performance and electromigration reliability. Additionally, a via hole opening can be created in second dielectric capping layer 316 to provided connectivity to a subsequent metal layer that may be formed.

Furthermore, those skilled in the art will note from the above description, that presented herein is a novel semiconductor integrated circuit interconnect structure and method for fabricating the interconnect structure having enhanced performance and reliability, by utilizing a graphene-based barrier metal layer to block oxygen intrusion from a dielectric layer into the interconnect structure and block copper diffusion from the interconnect structure into the dielectric layer. Lastly, the foregoing description of various aspects of the invention has been presented for purposes of illustration and description. It is not intended to be exhaustive or to limit the invention to the precise form disclosed and, obviously, many modifications and variations are possible. Such modifications and variations that may be apparent to a person skilled in the art are intended to be included within the scope of the invention as defined by the accompanying claims.

What is claimed is:

1. A method for fabricating an interconnect structure, the method comprising the steps of:
    forming at least one opening in a dielectric layer, the at least one opening including at least a bottom and one or more adjacent sidewalls;
    forming a graphene-based barrier metal layer disposed directly on the at least one opening in the dielectric layer, wherein the graphene-based barrier metal layer is disposed directly on the one or more adjacent sidewalls of the dielectric layer and the graphene-based barrier metal layer is disposed directly on the bottom of the dielectric layer;
    forming a seed layer disposed on the graphene-based barrier metal layer;
    forming an electroplated copper layer disposed on the seed layer;
    forming a planarized surface, wherein a portion of the graphene-based barrier metal layer, the seed layer, and the electroplated copper layer are removed; and
    forming a capping layer disposed on the planarized surface.

2. The method of claim 1, wherein the at least one opening further comprises a trench area, the trench area with at least one via hole, or a combination thereof.

3. The method of claim 1, wherein:
    forming the graphene-based barrier metal layer comprises utilizing electrostatic deposition at a temperature ranging from about 15° C. to about 25° C.;
    the graphene-based barrier metal layer is multi-layered and comprises more than one single atomic layer of $sp^2$-bonded carbon atoms densely packed into a hexagonal crystal lattice; and
    the graphene-based barrier metal layer has a thickness ranging from about 0.3 nm to about 0.9 nm.

4. The method of claim 1, wherein:
    forming the graphene-based barrier metal layer comprises utilizing chemical vapor deposition (CVD) at a temperature ranging from about 25° C. to about 400° C.;
    the graphene-based barrier metal layer is a metal alloy comprising tantalum and graphene, or tantalum nitride and graphene; and
    the graphene-based barrier metal layer has a thickness ranging from about 0.15 nm to about 0.9 nm.

5. The method of claim 1, wherein:
    forming the seed layer comprises utilizing physical vapor deposition (PVD) or chemical vapor deposition (CVD); and
    the seed layer comprises pure copper.

6. The method of claim 1, wherein:
    forming the seed layer comprises utilizing physical vapor deposition (PVD) or chemical vapor deposition (CVD);
    the seed layer comprises a copper alloy having impurities; and
    the impurities include manganese, aluminum, tin, or a combination thereof.

7. The method of claim 1, wherein the electroplated copper layer is annealed at a temperature ranging from about 50° C. to about 350° C. to enhance grain growth of copper within the interconnect structure.

8. The method of claim 7, wherein:
    the temperature is high enough to enhance diffusion of impurities within the interconnect structure; and
    the impurities include manganese, aluminum, tin, or a combination thereof.

9. The method of claim 1, wherein:
    forming the capping layer comprises utilizing chemical vapor deposition (CVD) and at a temperature ranging from about 350° C. to about 400° C.; and
    the capping layer is a dielectric capping layer.

10. A method for fabricating an interconnect structure, the method comprising the steps of:
    forming at least one opening in a dielectric layer;
    forming a graphene-based barrier metal layer disposed directly on the at least one opening in the dielectric layer, wherein forming the graphene-based barrier metal layer comprises utilizing electrostatic deposition at a temperature ranging from about 15° C. to about 25° C., the graphene-based barrier metal layer comprises a single atomic layer of $sp^2$-bonded carbon atoms densely packed into a hexagonal crystal lattice, and the graphene-based barrier metal layer has a thickness of about 0.15 nm; and
    wherein the at least one opening including at least a bottom and one or more adjacent sidewalls, and wherein the graphene-based barrier metal layer is disposed directly on the one or more adjacent sidewalls of the dielectric layer and the graphene-based barrier metal layer is disposed directly on the bottom of the dielectric layer;
    forming a seed layer disposed on the graphene-based barrier metal layer;
    forming an electroplated copper layer disposed on the seed layer;
    forming a planarized surface, wherein a portion of the graphene-based barrier metal layer, the seed layer, and the electroplated copper layer are removed; and
    forming a capping layer disposed on the planarized surface.

* * * * *